United States Patent
Mitros et al.

(10) Patent No.: US 7,019,356 B2
(45) Date of Patent: Mar. 28, 2006

(54) MEMORY DEVICE WITH REDUCED CELL AREA

(75) Inventors: Jozef Mitros, Richardson, TX (US); Victor Ivanov, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/910,210

(22) Filed: Aug. 2, 2004

(65) Prior Publication Data

US 2006/0022258 A1    Feb. 2, 2006

(51) Int. Cl.
*H01L 29/788*    (2006.01)
*H01L 31/119*    (2006.01)
*H01L 29/76*    (2006.01)
*H01L 29/94*    (2006.01)
*H01L 31/062*    (2006.01)

(52) U.S. Cl. .................... 257/318; 257/316; 257/344; 257/408

(58) Field of Classification Search ............ 257/315, 257/316, 318, 344, 408
See application file for complete search history.

(56) References Cited

U.S. PATENT DOCUMENTS 6,617,637 B1*    9/2003    Hsu et al. ................. 257/315
6,674,119 B1*    1/2004    Hashimoto et al. ....... 257/315
2002/0190310 A1*    12/2002    Boivin ..................... 257/318

* cited by examiner

*Primary Examiner*—Ngân V. Ngô
(74) *Attorney, Agent, or Firm*—Jacqueline J. Garner; W. James Brady, III; Frederick J. Telecky, Jr.

(57) ABSTRACT

The present invention provides for a memory device comprising a bulk substrate. A first lightly doped region is formed in the bulk substrate. A first active region is formed in the first lightly doped region. A second lightly doped region is formed in the bulk substrate. A second active region is formed in the second lightly doped region. A third active region is formed in the bulk substrate. An oxide layer is disposed outwardly from the bulk substrate and a floating gate layer is disposed outwardly from the oxide layer. In a particular aspect, a memory device is provided that is a single poly electrically erasable programmable read-only memory (EEPROM) with a drain or source electrode configured to remove negative charge from the gate and erase the EEPROM, without a separate erase region.

16 Claims, 3 Drawing Sheets

MEMORY DEVICE WITH REDUCED CELL AREA

TECHNICAL FIELD

The present invention relates generally to the field of non-volatile memory devices and, more particularly, to a memory device with reduced cell area.

BACKGROUND

Modern devices, such as mobile telephones, digital cameras, and computers, for example, often employ non-volatile memory, which can store data when the device is not connected to a power supply. Non-volatile memory is typically either permanent, where data cannot be erased after it is written, or impermanent, where data can be erased and re-written. One example of impermanent non-volatile memory is an electrically erasable programmable read-only memory (EE PROM). Data stored in an EEPROM can be retained without requiring a constant power supply, but can also be erased and re-written, allowing for flexible non-volatile memory storage.

However, typical EEPROM memory devices include a separate erase region in each memory cell, in order to erase and re-program the memory device. A separate erase region can increase the footprint area of individual memory cells, which reduces the number of memory cells that can be included on a single die or integrated circuit, and can increase the die cost. A large cell area limits the number of memory cells that can be included in a particular device, thereby restricting the functionality and applications in which the EEPROM can be employed. Moreover, a large cell area increases the manufacturing, processing, and other costs associated with production of memory devices.

Therefore, there is a need for a system and/or method for a non-volatile memory device that addresses at least some of the problems and disadvantages associated with conventional systems and methods.

SUMMARY

The present invention provides for a memory device comprising a bulk substrate. A first lightly doped region is formed in the bulk substrate. A first active region is formed in the first lightly doped region. A second lightly doped region is formed in the bulk substrate. A second active region is formed in the second lightly doped region. A third active region is formed in the bulk substrate. An oxide layer is disposed outwardly from the bulk substrate and a floating gate layer is disposed outwardly from the oxide layer.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Moreover, specific details, dimensions, and/or values are presented herein for illustrative or exemplary purposes only, and are not intended to limit the scope of the present invention, unless expressly included in the claims below.

Figure 1:
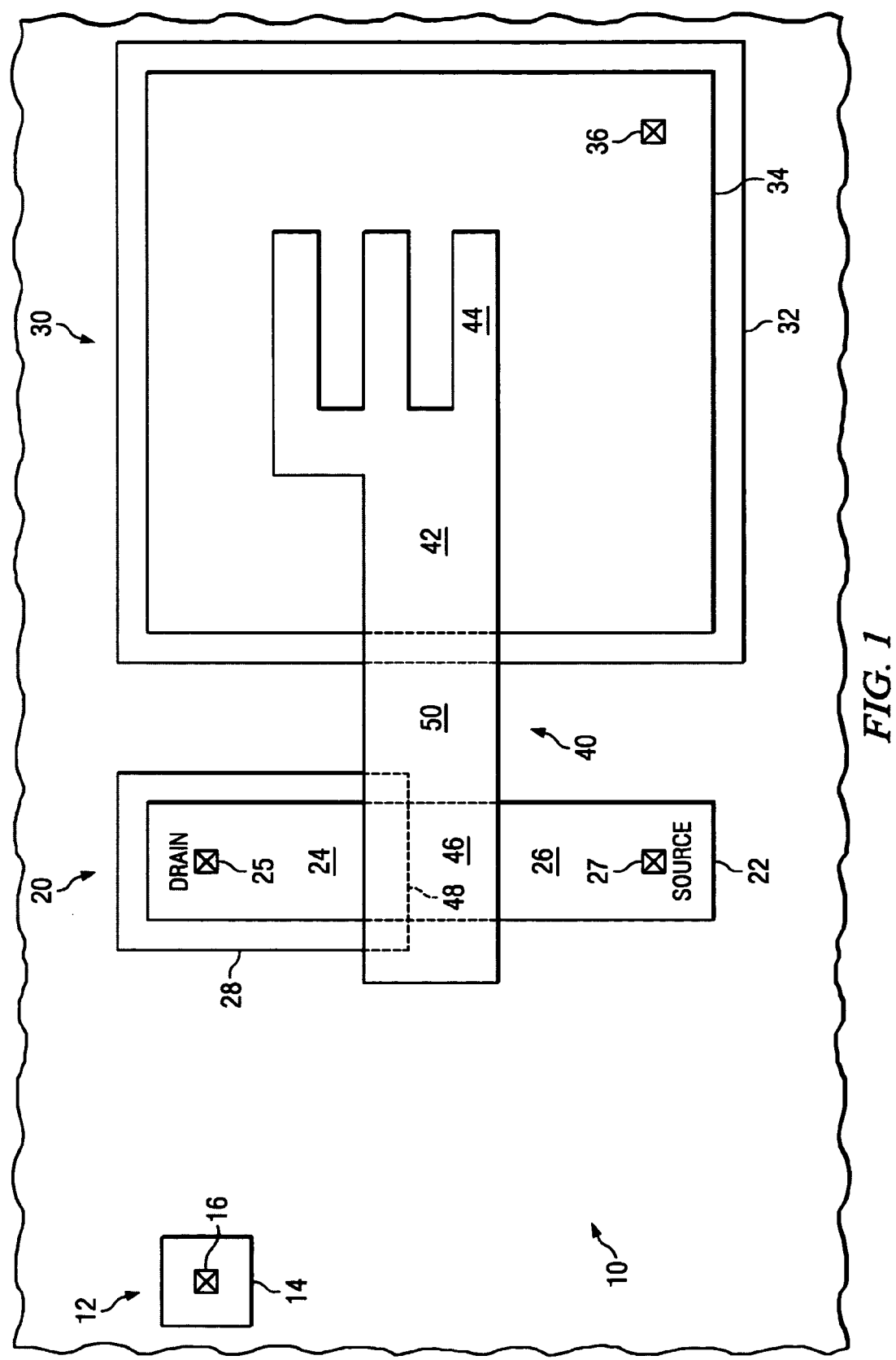
FIG. 1 is a block diagram depicting a memory device with reduced cell area.

Referring to FIG. 1 of the drawings, the reference numeral 10 generally designates a memory device, in particular a single poly (SP) EEPROM. For ease of illustration, memory device 10 will be described herein with respect to an n-channel SP EEPROM. It will be understood that the present invention can also be employed in a variety of non-volatile memory devices, without departing from the scope of the invention. Memory device 10 includes a read transistor 20, a control gate 30, and a floating gate 40. Memory device 10 is also depicted with a back gate connection region 12, which is included for ease of illustration. It will be understood that while back gate connection region 12 is not required to practice the present invention, it may be included without departing from the scope of the present invention.

Generally, the components of memory device 10 are formed in and/or on a common or "bulk" substrate. In the illustrated embodiment, where memory device 10 is an n-channel SP EEPROM, the bulk substrate can be a p-well, p– region, or other suitable substrate. In an alternate embodiment, where memory device 10 is a p-channel SP EEPROM, the bulk substrate can be an n-well, n– region, or other suitable substrate. Additionally, the bulk substrate can be formed in and/or on a base substrate common to one or more other devices. For example, a p-well bulk substrate and an n-well bulk substrate can be formed in separate regions of a common base substrate, and an n-channel SP EEPROM formed in the p-well bulk substrate and a p-channel SP EEPROM formed in the n-well bulk substrate. It will be understood to one skilled in the art that other suitable configurations can also be employed.

As described above, in the illustrated embodiment memory device 10 is an n-channel SP EEPROM formed in a bulk substrate. The bulk substrate can be a p-well, p– region, or other suitable substrate, and can also form a backgate of an n-channel SP EEPROM read NMOS transistor. In an alternate embodiment, memory device 10 is a p-channel SP EEPROM formed in a bulk substrate that can be an n-well, an n– region, or other suitable substrate.

Back gate connection region 12 includes an active region 14 and a back gate contact 16. Where memory device 10 is an n-channel SP EEPROM, active region 14 is an active p+ region and can be formed as p– silicon, doped p– silicon, or otherwise suitably formed. Back gate contact 16 is a conductive material configured to convey to active region 14 a voltage applied to back gate contact 16. Back gate contact 16 can be any one of a variety of conductive materials, such as, for example, aluminum (Al), tungsten (W), copper (Cu), titanium tungsten (TiW), titanium nitride (TiN), doped polysilicon, or other suitable conductive material. In one embodiment, back gate connection region 12 is configured to operate as a power control for memory device 10.

Memory device 10 also includes read transistor 20. Read transistor 20 includes bulk 22, drain region 24, drain contact 25, source region 26, source contact 27, and lightly doped drain extension (LDDE) 28. Generally, bulk 22 is the same type of substrate upon which the other components of memory device 10 are formed, as described in more detail below. Accordingly, bulk 22 can be a p-well, a p– region, an n-well, an n– region, or other suitable substrate. Where memory device 10 is an n-channel SP EEPROM, bulk 22 is a p-well, p– region, or other suitable substrate. In a particular embodiment, bulk 22 is a p-well. Where memory device 10 is a p-channel SP EEPROM, bulk 22 is an n-well, n– region, or other suitable substrate. In a particular embodiment, bulk 22 is an n-well.

Drain region 24 is a section or area of bulk 22 that has been doped with ions of a carrier type opposite that of bulk 22. For example, where memory device 10 is an n-channel SP EEPROM and bulk 22 is a p-well, drain region 24 is doped with n-type ions to form an n+ silicon. Drain contact 25 is a conductive material configured to convey to drain region 24 a voltage applied to drain contact 25. Drain contact 25 can be any one of a variety of conductive materials, such as, for example, aluminum (Al), tungsten (W), copper (Cu), titanium tungsten (TiW), titanium nitride (TiN), doped polysilicon, or other suitable conductive material.

Source region 26 is a section or area of bulk 22 that has been doped with ions of a carrier type opposite that of bulk 22. For example, where memory device 10 is an n-channel EEPROM and bulk 22 is a p-well, source region 26 is doped with n-type ions to form an n+ silicon. Source contact 27 is a conductive material configured to convey to source region 26 a voltage applied to source contact 27. Source contact 27 can be any one of a variety of conductive materials, such as, for example, aluminum (Al), tungsten (W), copper (Cu), titanium tungsten (TiW), titanium nitride (TiN), doped polysilicon, or other suitable conductive material.

Lightly doped drain extension (LDDE) 28 is a section or area of bulk 22 and the underlying substrate upon which bulk 22 is formed that has been doped with an implant as described in more detail below. In a particular embodiment, where memory device 10 is an n-channel SP EEPROM, LDDE 28 is doped with phosphorus P31, as a p-channel threshold voltage (VTP) implant. In an alternate embodiment, LDDE 28 is doped with P31, as an n-channel drain extended transistor (DEN) implant, which is often employed to form an extension of an n-channel drain extended transistor. In a particular embodiment, LDDE 28 is formed so that a breakdown voltage (BVd) of memory device 10 is at least 13 V.

Memory device 10 also includes control gate 30. Control gate 30 includes implant substrate 32, active region 34, and control gate contact 36. Generally, active region 34 is a section or area of implant substrate 32 that has been doped with ions of a carrier type opposite that of the bulk substrate, as described in more detail below. Where memory device 10 is an n-channel SP EEPROM, the bulk substrate is a p-substrate and active region 32 is doped with n-type ions to form an n+ region. Where memory device 10 is a p-channel SP EEPROM, the bulk substrate is an n-substrate and active region 32 is doped with p-type ions to form a p+ region.

Implant region 32 is a section or area of the bulk substrate, upon which active region 34 is formed, that has been doped with an implant as described in more detail below. In a particular embodiment, implant region 32 is doped with phosphorus P31 as a p-channel VTP implant. In an alternate embodiment, implant substrate 32 is doped with P31 as a DEN. In a particular embodiment, implant region 32 is formed so that a breakdown voltage (BVd) of memory device 10 is at least 13 V.

Control gate contact 36 is a conductive material configured to convey to active region 34 a voltage applied to control gate contact 36. Control gate contact 36 can be any one of a variety of conductive materials, such as, for example, aluminum (Al), tungsten (W), copper (Cu), titanium tungsten (TiW), titanium nitride (TiN), doped polysilicon, or other suitable conductive material.

Memory device 10 also includes floating gate 40. Floating gate 40 includes fork or block shaped region 42 over implant substrate 32 and active region 34, one or more tines 44, read-transistor region 46, erase-overlap region 48, and connector region 50. Floating gate 40 is a polycrystalline silicon (polysilicon) material. Floating gate 40 can be doped to render floating gate 40 conductive, by any number of methods well known to those skilled in the art. Generally, fork or block shaped region 42 is the section or area of floating gate 40 that is formed over or overlaps implant region 32 and active region 34 of control gate 30. In the illustrated embodiment, fork or block shaped region 42 is formed as a fork-type structure and includes one or more tines 44. It will be understood to one skilled in the art that other configurations can also be employed. For example, fork or block shaped region 42 can also be formed as a block, rectangle, or other suitable configuration.

Generally, read-transistor region 46 is the section or area of floating gate 40 that is formed over or overlaps bulk 22 of read transistor 20. Generally, erase-overlap region 48 is the section or area of floating gate 40 that is formed over or overlaps bulk 22 and LDDE 28 of read transistor 20. Generally, connector region 50 is the section or area of floating gate 40 that connects fork or block shaped region 42 and read-transistor region 46. It will be understood to one skilled in the art that other configurations can also be employed. In a particular embodiment, fork or block shaped region 42 and erase-overlap region 48 are formed in a configuration such that the resultant coupling ratio is approximately 0.75.

Generally, in operation, the charge associated with floating gate 40 determines a threshold voltage (Vt) of memory device 10. The threshold voltage, in turn, determines a drain read current (Idread) that flows through memory device 10 when certain voltages are applied to drain contact 25 and control gate contact 36, which can be employed to determine a logic state of memory device 10. In a particular embodiment, memory device 10 is at a logic high state when drain read current Idread is at a predetermined high level and memory device 10 is at a logic low state when drain current Idread is at a predetermined low level.

Memory device 10 can be programmed by application of a specific voltage to control gate contact 36, with back gate contact 16, drain contact 25, and source contact 27 grounded. Electrons flow into floating gate 40, which develops a negative charge, increasing the threshold voltage Vt of memory device 10, which reduces the drain read current Idread. In a particular embodiment where a gate oxide thickness of memory device 10 is seventy-five angstroms, memory device 10 is programmed when a voltage of 13 V is applied to control gate contact 36. In an alternate embodiment where a gate oxide thickness of memory device 10 is one hundred and twenty angstroms, memory device 10 is programmed when a voltage of 17 V is applied to control gate contact 36. It will be understood to one skilled in the art that other configurations can also be employed.

Memory device 10 can be erased by application of a specific voltage to drain contact 25, with back gate contact 16 and control gate contact 36 grounded and source contact 27 floating. Electrons flow out of floating gate 40, which develops a neutral or positive charge, decreasing the threshold voltage Vt of memory device 10, which results in an increase in the drain read current Idread. In a particular embodiment where a gate oxide thickness of memory device 10 is seventy-five angstroms, memory device 10 is erased when a voltage of 13 V is applied to drain contact 25. In an alternate embodiment where a gate oxide thickness of memory device 10 is one hundred and twenty angstroms, memory device 10 is erased when a voltage of 17 V is applied to drain contact 25. It will be understood to one skilled in the art that other configurations can also be employed. Generally, the time required to program and erase memory device 10 can vary between one millisecond and one hundred milliseconds. In a particular embodiment, the time required to program and erase memory device 10 is less than ten milliseconds.

The illustrated embodiment is depicted with respect to a drain-erase memory device. In particular, drain region 24 is formed in LDDE 28. It will be understood to one skilled in the art that memory device 10 can also be configured to operate as a source-erase memory device. Where memory device 10 is a source-erase memory device, source region 26 is formed in LDDE 28.

Therefore, memory device 10 provides a SP EEPROM that does not require a separate erase region. Moreover, the separation between control gate 30 and read transistor 20 can be smaller than typical SP EEPROM devices. Thus, memory device 10 provides a cell area that can be smaller than typical SP EEPROM cell areas by about 30%. The reduced cell area can result in reduced die costs, increased cell density, increased device performance, and other advantages.

Figure 2:
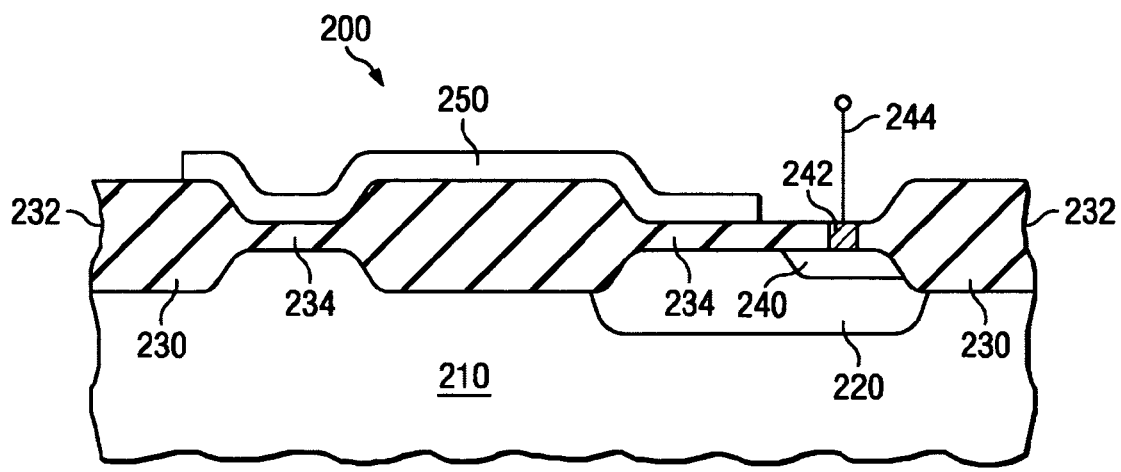
FIG. 2 is a cross-sectional view of one aspect of a memory device with reduced cell area.

Referring now to FIG. 2, the reference numeral 200 generally indicates a semiconductor memory device, depicted in a cross-sectional view. In the illustrated embodiment, memory device 200 is depicted as an n-channel SP EEPROM. Memory device 200 includes substrate 210, n-type lightly doped region 220, oxide layer 230, n+ region 240, and floating gate 250. Substrate 210 can be a wafer formed from a single crystalline silicon material, a polysilicon material, an epitaxial material, or other suitable material. Additionally, substrate 210 can include multiple layers of suitable material or other suitable structures or other material without departing from the scope of the present invention. In the illustrated embodiment, substrate 210 is doped with an amount of p-type ions sufficient to form a p-well.

N-type lightly doped region 220 is formed in substrate 210 and is configured as an n– region. In one embodiment, a p-channel threshold voltage (VTP) implant or an n-channel drain extended transistor (DEN) implant can be used to form n-type lightly doped region 220. In one embodiment, n-type lightly doped region 220 is formed by doping with between 1e12 and 6e12 Phosphorous ions at 50 KeV. In a particular embodiment, n-type lightly doped region 220 is formed by doping with 4e12 Phosphorous ions at 50 KeV. In an alternate embodiment, n-type lightly doped region 220 is also doped with 4e12 Phosphorous ions at 150 KeV.

Oxide layer 230 is formed over substrate 210 and n-type lightly doped region 220, and can be formed by any of a number of methods known to one skilled in the art. In one embodiment, oxide layer 230 is formed over substrate 210 before n-type lightly doped region 220 is formed in substrate 210, as described in more detail below. Oxide layer 230 includes field oxide region 232 and gate oxide region 234. In one embodiment, oxide layer 230 is formed so that a thickness of gate oxide region 234 is seventy-five angstroms thick. In an alternate embodiment, oxide layer 230 is formed so that a thickness of gate oxide region 234 is one hundred and twenty angstroms thick. It will be understood to one skilled in the art that oxide layer 230 can be formed so that gate oxide 234 is formed to other suitable thicknesses.

N+ region 240 is formed in n-type lightly doped region 220, and can be formed by any of a number of methods known to one skilled in the art to produce an n+ region. N+ region 240 is coupled to contact 242, which is formed in gate oxide region 234 and is coupled to a lead 244. Contact 242 and lead 244 can be any of number of materials suitable to be configured to conduct electricity or otherwise convey an electrical charge to n+region 240. Floating gate 250 is formed above the oxide layer 230 and can be a conductive polysilicon material or other suitable material. Floating gate 250 can be formed by any of a number of methods known to one skilled in the art.

Generally, in operation, memory device 200 is an n-channel SP EEPROM. In particular, application of a specific voltage to n+ region 240 causes electrons to pass from substrate 210, through gate oxide region 234 to floating gate 250. Accumulation of electrons on floating gate 250 results in a negative charge on floating gate 250. Thus, memory device 200 has been programmed and its threshold voltage Vt is at a predetermined high level. It will be understood to one skilled in the art that a predetermined high level of threshold voltage Vt is determined by the SP EEPROM configuration and is considered "high" with respect to a predetermined low level of threshold voltage Vt for memory device 200.

Figure 3:
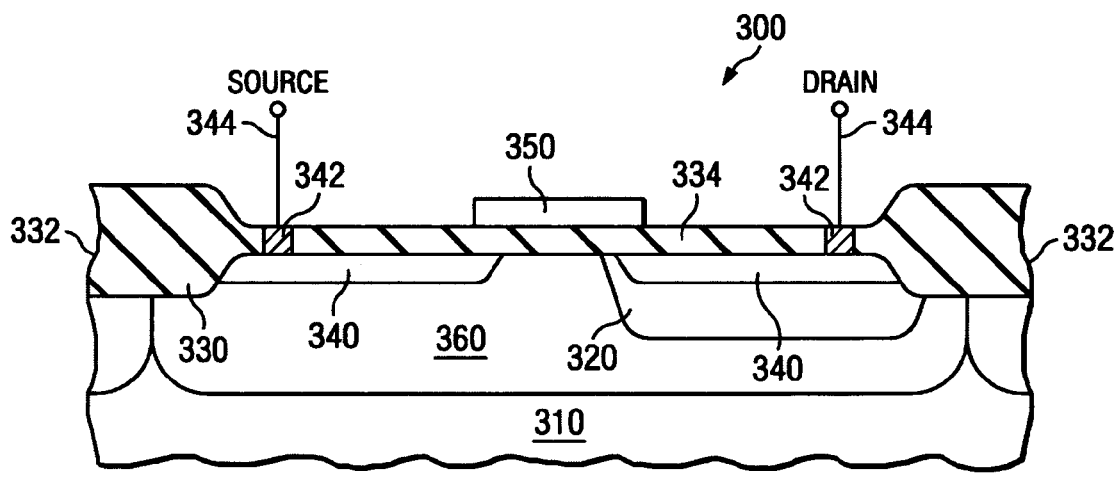
FIG. 3 is a cross-sectional view of another aspect of a memory device with reduced cell area.

Referring now to FIG. 3, the reference numeral 300 generally indicates a semiconductor memory device, depicted in a cross-sectional view. In the illustrated embodiment, memory device 300 is depicted with respect to a read transistor of an n-channel SP EEPROM. It will be understood to one skilled in the art that memory device 300 can also be configured as a p-channel SP EEPROM. Memory device 300 includes substrate 310, lightly doped n– region 320, oxide layer 330, n+ regions 340, floating gate 350, and p-well 360. Substrate 310 can be a wafer formed from a single crystalline silicon material, an epitaxial material, or other suitable material. Additionally, substrate 310 can include multiple layers of suitable material or other suitable structures or other material without departing from the scope of the present invention.

In the illustrated embodiment, substrate 310 includes p-well 360. P-well 360 can be formed by doping substrate 310 with an amount of p-type ions sufficient to form a p-well or otherwise suitably formed. Lightly doped n– region 320 is formed inside p-well 360, and is configured as an n– region. Lightly doped n– region 320 can be formed by a p-channel threshold voltage (VTP) implant, an n-channel drain extended transistor (DEN) implant, or otherwise suitably formed. In one embodiment, lightly doped n– region 320 is formed by doping substrate 310 with between 1e12 and 6e12 Phosphorous ions at 50 KeV. In a particular embodiment, lightly doped n– region 320 is formed by doping with 4e12 Phosphorous ions at 50 KeV. In an alternate embodiment, lightly doped n–region 320 is also doped with 4e12 Phosphorous ions at 150 KeV. Lightly doped n– region 320 can also be configured to reduce the possibility of punch-through in memory device 300 and to ensure a desired threshold voltage Vt of n-channel MOS transistors. As described above, lightly doped n– region 320 is formed with respect to only one electrode region, either a source electrode region or a drain electrode region. Whether lightly doped n– region 320 is formed with respect to a source electrode region or a drain electrode region determines whether memory device 300 is configured for source-erasure or drain-erasure.

Oxide layer 330 is formed over substrate 310, p-well 360, and lightly doped n-region 320, and can be formed by any of a number of methods known to one skilled in the art. Oxide layer 330 includes field oxide region 332 and gate oxide region 334. In one embodiment, oxide layer 330 is formed so that a thickness of gate oxide region 334 is seventy-five angstroms thick. In an alternate embodiment, oxide layer 330 is formed so that a thickness of gate oxide region 334 is one hundred and twenty angstroms thick. It will be understood to one skilled in the art that oxide layer 330 can be formed so that gate oxide 334 is formed to other suitable thicknesses.

An n+ region 340 is formed inside the lightly doped n– region 320 in the erase electrode region, and inside p-well 360 in the non-erase electrode region, and can be formed by any of a number of methods known to one skilled in the art to produce an n+ region. In the illustrated embodiment, memory device 300 is configured for drain-erasure, and drain n+ region 340 is formed in lightly doped n– region 320 and source n+ region 340 is formed in p-well 360. Source and drain n+ regions 340 are coupled to a contact 342, which is formed in gate oxide region 334 and is coupled to a lead 344. Contacts 342 and leads 344 can be any of number of materials suitable to be configured to conduct electricity or otherwise convey an electrical charge to n+ regions 340. Floating gate 350 is formed over the oxide layer 330 and can be a conductive polysilicon material or other suitable material. Floating gate 350 can be formed by any of a number of methods known to one skilled in the art.

As described above, in the illustrated embodiment memory device 300 is depicted in cross section with respect to a read transistor of an n-channel SP EEPROM. Generally, in operation, application of a specific voltage to drain electrode 344 causes electrons to pass or otherwise be removed from floating gate 350. Removing electrons from floating gate 350 results in a neutral or positive charge on floating gate 350. Thus, memory device 300 has been erased and its threshold voltage Vt is at a predetermined low level. It will be understood to one skilled in the art that a predetermined low level of threshold voltage Vt is determined by the SP EEPROM configuration, and is considered "low" with respect to a predetermined high level of threshold voltage Vt for memory device 300. Accordingly, a predetermined low level of threshold voltage Vt can be low positive, zero, negative, or otherwise suitably configured.

Thus, it will be understood to one skilled in the art that memory device 300 can be configured as a read transistor of an SP EEPROM and can be employed to identify a memory state of the SP EEPROM. For example, in one embodiment, memory device 300 can be configured with a logic high memory state and a logic low memory state. In one embodiment, memory device 300 is in a logic high state when memory device 300 has been erased. In a particular embodiment, a logic high memory state is associated with a neutral or positive charge on floating gate 350, as expressed by a threshold voltage Vt at a predetermined low level and/or a drain read current Idread at a predetermined high level. In one embodiment, memory device 300 is in a logic low state when memory device 300 has been programmed. In a particular embodiment, a logic low memory state is associated with a negative charge on floating gate 350, as expressed by a threshold voltage Vt at a predetermined high level and/or a drain read current Idread at a predetermined low level. It will be understood to one skilled in the art that other configurations can also be employed.

FIGS. 4A through 4D generally illustrate a method of forming a memory device, such as, for example, memory device 10 of FIG. 1, in accordance with one embodiment of the present invention. In particular, the method illustrated in FIGS. 4A through 4D is described with respect to an n-channel SP EEPROM. It will be understood to one skilled in the art that other devices can also be formed in conjunction or concurrently with the illustrated method, including, for example, transistors, capacitors, and other suitable semiconductor devices. Additionally, for ease of understanding, details of the method of forming a read transistor, such as, for example, read transistor 20 of FIG. 1, have been omitted. It will be understood to one skilled in the art that other memory devices can also be formed by the method illustrated in FIGS. 4A through 4D without departing from the spirit or scope of the present invention.

Figure 4A:
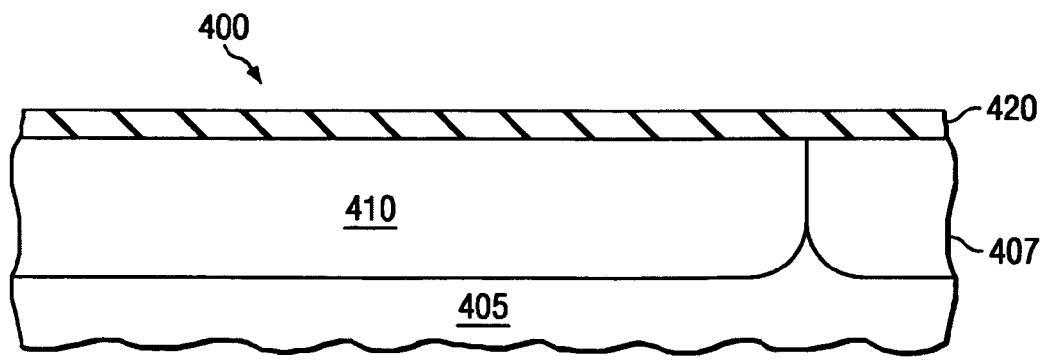
FIGS. 4A–4D are cross-sectional views depicting a method for forming one aspect of a memory device with reduced cell area.

Referring now to FIG. 4A, memory device 400 includes a p-well 410 formed in a p-type substrate 405. As described above, p-type substrate 405 can also include one or more other wells and/or regions, such as for example, n-well 407. An oxide layer 420 is disposed outwardly from p-type substrate 405 over p-well 410, and other regions, if any, such as, for example, n-well 407.

Figure 4B:
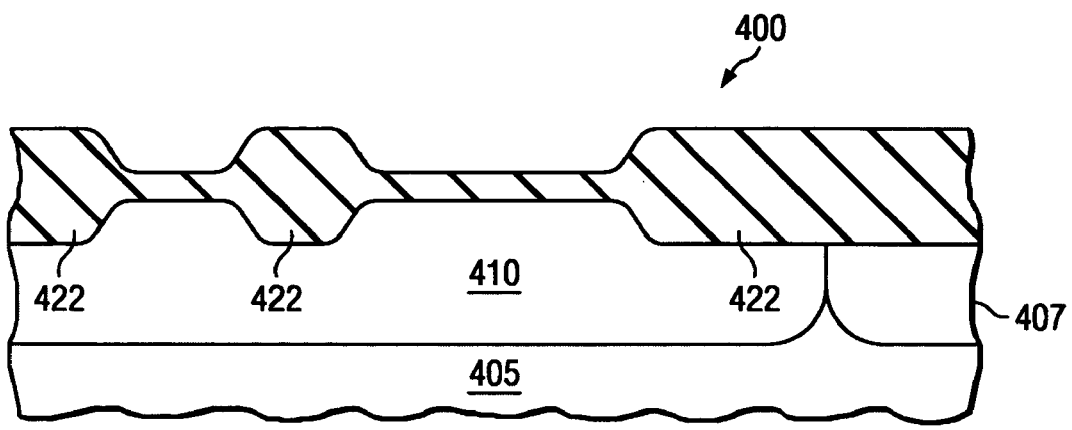

Referring now to FIG. 4B, field oxide regions 422 are formed in oxide layer 420. Field oxide region 422 can be formed by any of a variety of methods and techniques known to one skilled in the art.

Figure 4C:
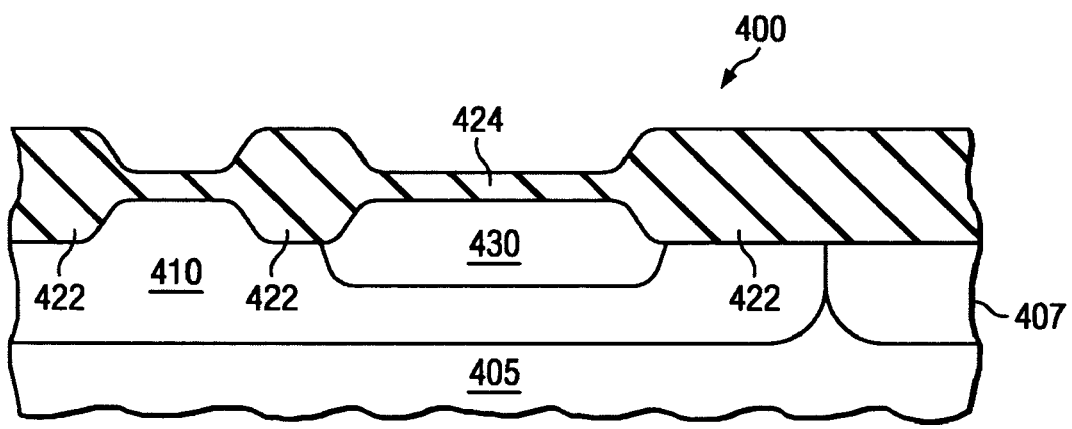

Referring now to FIG. 4C, a lightly doped region 430 is formed in p-well 410. Lightly doped region 430 can be formed by a p-channel threshold voltage (VTP) implant, an n-channel drain extended transistor (DEN) implant, or otherwise suitably formed. In one embodiment, lightly doped region 430 is formed by a p-channel threshold voltage (VTP) implant, doping p-well 410 with between 1e12 and 6e12 phosphorous P31 ions at 50 KeV. In a particular embodiment, lightly doped region 430 is formed by doping p-well 410 with 4e12 phosphorous P31 ions at 50 KeV. In an alternate embodiment, p-well 410 is also doped with 4e12 phosphorous P31 ions at 150 Kev. Lightly doped region 430 can be restricted to a particular area of p-well 410 through any of a variety of isolation methods and techniques well known to those skilled in the art.

Gate oxide regions 424 are formed in oxide layer 420. In particular, gate oxide regions 424 are formed in all active regions, which, generally, are the silicon or other surfaces not covered with a field oxide region 422. Gate oxide regions 424 can be formed by any number of methods and/or techniques well known to those skilled in the art. In one embodiment, field oxide regions 422 can be between three thousand and nine thousand angstroms thick. In a particular embodiment, field oxide regions 422 are approximately five thousand angstroms thick. In one embodiment, gate oxide regions 424 can be between sixty and two hundred angstroms thick. It will be understood to one skilled in the art that other suitable thicknesses can also be employed.

Figure 4D:
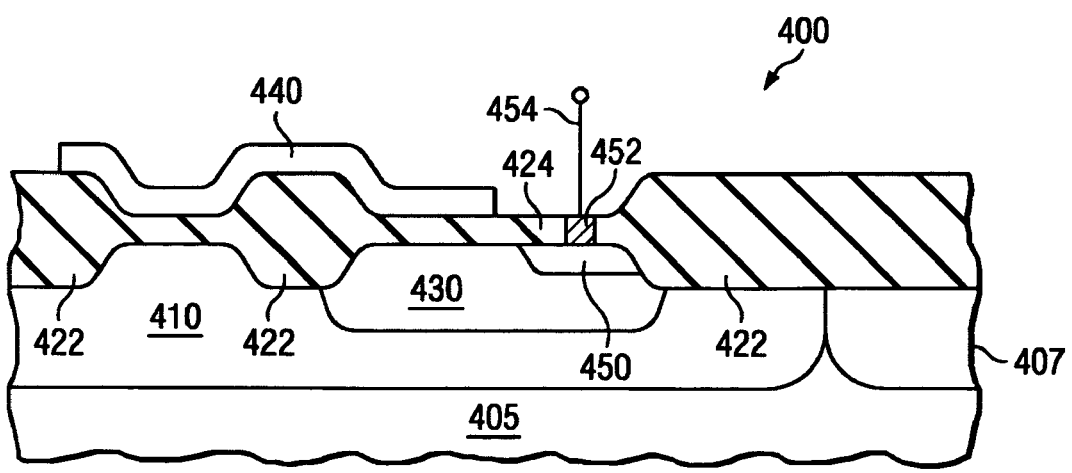

Referring now to FIG. 4D, a polysilicon layer 440 is deposited. In one embodiment, polysilicon layer 440 is formed with a thickness of between one thousand angstroms and five thousand angstroms. In one embodiment, polysilicon layer 440 is in-situ doped. In an alternate embodiment, polysilicon layer 440 is doped concurrently with control gate n+region 450, as described below. In the illustrated embodiment, polysilicon layer 440 is patterned and etched to form MOS transistor gates, including an SP EEPROM floating gate. Control gate n+region 450 is formed in lightly doped region 430, and can be formed through any of a variety of methods and techniques well known to those skilled in the art. It will be understood to one skilled in the art that source and drain n+regions can also be formed concurrently with control gate n+region 450.

A contact region 452 and lead 454 are formed in gate oxide region 424, through any of a variety of methods and techniques well known to those skilled in the art. Contact region 452 and lead 454 are configured to conduct electricity or otherwise convey an electrical charge to control gate n+region 450, and can be any of a variety of conductive materials, such as, for example, aluminum (Al), tungsten (W), copper (Cu), titanium tungsten (TiW), titanium nitride (TiN), doped polysilicon, or other suitable conductive material. Thus, control gate n+region 450 can serve as a connection to the control gate of the SP EEPROM.

Accordingly, FIGS. 4A through 4D illustrate a method for forming an SP EEPROM without a separate erase region. The read transistor drain or source electrode is configured to remove negative charge from the floating gate to erase the SP EEPROM, and therefore, a separate erase region is avoided. Moreover, providing for drain or source electrode erasure results in an SP EEPROM with a smaller cell area than typical SP EEPROM devices by about 30%. The reduced cell area can result in an increase in the number of devices that can fit on a single integrated circuit or chip, and can reduce die cost and other manufacturing costs. Other advantages and benefits of the present invention will be apparent to one skilled in the art.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A memory device, comprising:
    a bulk substrate;
    a first lightly doped region formed in the bulk substrate;
    a first active region formed in the first lightly doped region;
    a second lightly doped region formed in the bulk substrate;
    a second active region formed in the second lightly doped region;
    a third active region formed in the bulk substrate;
    an oxide layer disposed outwardly from the bulk substrate; and
    a floating gate layer disposed outwardly from the oxide layer.

2. The memory device as recited in claim 1, wherein:
    the second active region comprises a first electrode; and
    the third active region comprises a second electrode.

3. The memory device as recited in claim 2, wherein the first electrode is a drain electrode.

4. The memory device as recited in claim 2, wherein the first electrode is a source electrode.

5. The memory device as recited in claim 1, wherein the first lightly doped region is a p-channel threshold voltage (VTP) implant region.

6. The memory device as recited in claim 1, wherein the second lightly doped region is a p-channel threshold voltage (VTP) implant region.

7. The memory device as recited in claim 1, wherein the first lightly doped region is an n-channel drain extended transistor (DEN) implant region.

8. The memory device as recited in claim 1, wherein the second lightly doped region is an n-channel drain extended transistor (DEN) implant region.

9. The memory device as recited in claim 1, wherein a coupling ratio is at least 0.75.

10. The memory device as recited in claim 1, wherein the floating gate layer is a fork-type floating gate layer.

11. The memory device as recited in claim 1, wherein the floating gate layer is a block-type floating gate layer.

12. The memory device as recited in claim 1, wherein the memory device is an n-channel single poly electrically erasable programmable read-only memory device.

13. The memory device as recited in claim 1, wherein the memory device is a p-channel single poly electrically erasable programmable read-only memory device.

14. A single poly electrically erasable programmable read-only memory device, comprising:
    a control gate comprising a first lightly doped region formed in a bulk substrate and an active region formed in the first lightly doped region;
    a floating gate coupled to the control gate; and
    a read transistor couplet to the floating gate, the read transistor comprising a second lightly doped region formed in the bulk substrate, a first electrode active region formed in the second lightly doped region, and a second electrode formed in the bulk substrate.

15. The single poly electrically erasable programmable read-only memory device as recited in claim 14, further configured as an n-channel single poly electrically erasable programmable read-only memory device.

16. The single poly electrically erasable programmable read-only memory device as recited in claim 14, further configured as a p-channel single poly electrically erasable programmable read-only memory device.

* * * * *